United States Patent
Edwards et al.

(10) Patent No.: US 7,086,896 B2
(45) Date of Patent: Aug. 8, 2006

(54) EXPANDABLE STANDOFF CONNECTOR WITH SLIT COLLAR AND RELATED METHOD

(75) Inventors: David L. Edwards, Poughkeepsie, NY (US); Ronald L. Hering, Pleasant Valley, NY (US); David C. Long, Wappingers Falls, NY (US); Jason S. Miller, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,198

(22) Filed: Oct. 28, 2004

(65) Prior Publication Data

US 2006/0094296 A1    May 4, 2006

(51) Int. Cl.
*H01R 13/73*    (2006.01)
(52) U.S. Cl. ...................................... 439/573
(58) Field of Classification Search ................. 439/563
See application file for complete search history.

(56) References Cited

U.S. PATENT DOCUMENTS

| | | | |
|---|---|---|---|
| 2,240,425 A * | 4/1941 | Sternbergh | ................... 411/433 |
| 3,675,531 A | 7/1972 | Lehman | |
| 4,726,722 A | 2/1988 | Wollar | |
| 4,784,550 A | 11/1988 | Wollar | |
| 4,854,793 A * | 8/1989 | Ollivier et al. | ................ 411/49 |
| 4,970,761 A | 11/1990 | Nakamura | |
| 5,754,412 A | 5/1998 | Clavin | |
| 6,024,603 A | 2/2000 | Chen et al. | |
| 6,183,285 B1 | 2/2001 | Szu | |
| 6,652,206 B1 | 11/2003 | Heflin et al. | |
| 6,712,544 B1 * | 3/2004 | Kruger et al. | ............. 411/60.1 |
| 2002/0027017 A1 | 3/2002 | Petri | |
| 2003/0156917 A1 | 8/2003 | Heflin et al. | |

FOREIGN PATENT DOCUMENTS

EP    1338804 A1    8/2003

* cited by examiner

*Primary Examiner*—Briggitte R. Hammond
(74) *Attorney, Agent, or Firm*—James J. Cioffi; Hoffman, Warnick & D'Alessandro, LLC (57) ABSTRACT

An expanding standoff connector is disclosed including a collar having a slit through a wall of the collar, a tapered interior surface and an exterior surface configured to engage an interior of a mounting opening of the circuit board. A fastener including a threaded portion and a substantially cone shaped portion configured to mate with the tapered interior surface of the collar is placed within the collar and advanced to expand the collar to mount the circuit board. A related method for mounting a circuit board is also disclosed. Since the expansion is horizontal only (purely radial), a more uniform radial expansion from top-to-bottom of the collar is applied to the circuit board and a best-fit alignment between a circuit board and heatsink can be maintained.

18 Claims, 8 Drawing Sheets

EXPANDABLE STANDOFF CONNECTOR WITH SLIT COLLAR AND RELATED METHOD

BACKGROUND OF THE INVENTION

1. Technical Field

The present invention relates generally to circuit board connectors, and more particularly, to a precision-locking standoff connector for mounting a circuit board with a slit collar.

2. Related Art

Figure 1:
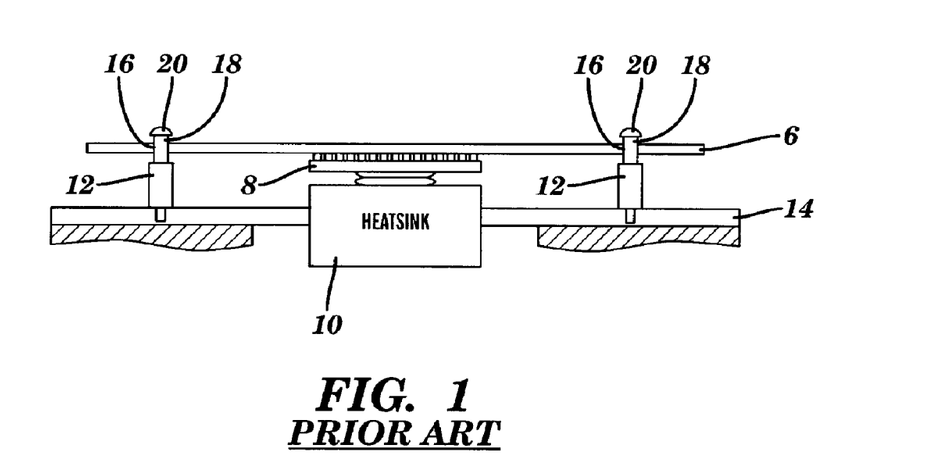
FIG. 1 shows a side view of a conventional circuit board expanding standoff connector.
Figure 2:
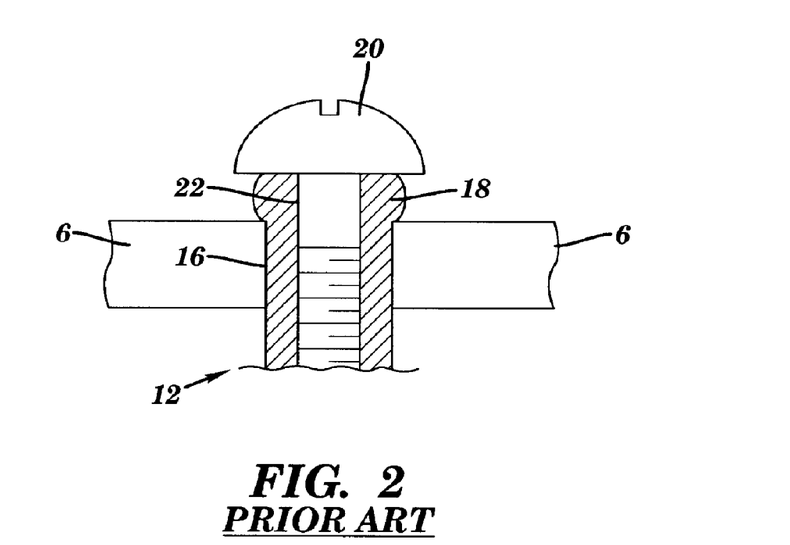
FIG. 2 shows a detailed side view of the connector of FIG. 1.

Electronic circuit board assembly requires the ability to securely lock a circuit board in place for proper operation. For example, typical personal computer (PC) circuit board operation requires locking the board into position after it, and in particular a chip connected thereto, has been "best-fit" to a copper heatsink or coldplate. The term "best-fit" refers to how the circuit board is coupled to the heatsink via thermal transmission materials in a near-perfectly parallel fashion. Establishing a thin, uniform thermal interface between chip and heatsink is critical for achieving adequate thermal performance for high powered applications. Variable height standoffs are sometimes used to accommodate variations in stack-up height and tilt. Non-parallelism between chip and heatsink will increase a thermal interface gap, thus decreasing thermal performance. Variable position standoffs enable parallel assembly between chip and heatsink while accommodating non-parallelism between circuit card and chassis. Referring to FIG. 1, one conventional approach for locking a circuit board 6 into position is shown. Circuit board 6 includes a chip 8 mounted to a heatsink or coldplate 10 via thermal transmission material. In this approach, as shown in FIG. 2, split expanding plastic standoff connectors 12 are used to mount circuit board 6. Returning to FIG. 1, in this setting, expanding plastic standoff connectors 12 are mounted to a chassis 14 and mounting openings 16 of circuit board 6 are placed over ends 18 of standoff connectors 12. As shown in FIG. 2, as threaded fastener 20 is tightened into end 18 of a standoff connector 12, slit portion 22 of standoff connector 12 expands against an interior of mounting opening 16. A drawback of this type mount is that, as standoff connector 12 expands, it tends to move circuit board 6 vertically and disturb the best-fit alignment of circuit board 6 (i.e., chip 8 thereof) to the heatsink/coldplate 10. For example, slit portion 22 tends to vertically move (with a V-shaped expansion profile) the circuit board 6 rather than simply horizontally clamp it in position.

In view of the foregoing, there is a need in the art for a standoff connector for maintaining a best-fit alignment between a circuit board and heatsink.

SUMMARY OF THE INVENTION

The invention includes an expanding standoff connector including a collar having a slit through a wall of the collar, a tapered interior surface and an exterior surface configured to engage an interior of a mounting opening of the circuit board. A fastener including a threaded portion and a substantially cone shaped portion configured to mate with the tapered interior surface of the collar is placed within the collar and advanced to expand the collar to mount the circuit board. A related method for mounting a circuit board is also disclosed. Since the expansion is horizontal only (purely radial), a more uniform radial expansion from top-to-bottom of the collar is applied to the circuit board and a best-fit alignment between a circuit board and heatsink can be maintained.

A first aspect of the invention is directed to an expanding standoff connector for mounting a circuit board, the connector comprising: a collar including a slit through a wall of the collar, a tapered interior surface and an exterior surface configured to engage an interior of a mounting opening of the circuit board; and a fastener including a threaded portion and a substantially cone shaped portion, the substantially cone shaped portion configured to mate with the tapered interior surface of the collar, wherein advancement of the fastener through the collar forces the substantially cone shaped portion against the tapered interior surface to expand the exterior surface of the collar against the interior of the mounting opening to mount the circuit board.

A second aspect of the invention includes an expanding standoff connector for mounting a circuit board, the connector comprising: a collar including an expanding slit region having a tapered interior surface and an exterior surface for engaging an interior of a mounting opening of the circuit board; and a fastener including a threaded portion and a substantially cone shaped portion, the substantially cone shaped portion configured to mate with the tapered interior surface of the collar, wherein advancement of the fastener through the collar forces the substantially cone shaped portion against the tapered interior surface to expand the exterior surface of the collar against the interior of the mounting opening to mount the circuit board.

A third aspect of the invention includes a method for mounting a circuit board using an expandable standoff connector, the method comprising the steps of: inserting a collar of the expandable standoff connector within an interior of a mounting opening of the circuit board, the collar including a slit through a wall of the collar, a tapered interior surface and an exterior surface configured to engage an interior of a mounting opening of the circuit board; providing a fastener including a threaded portion and a substantially cone shaped portion, the substantially cone shaped portion configured to mate with the tapered interior surface of the collar; and advancing the fastener through the collar to force the substantially cone shaped portion against the tapered interior surface to expand the exterior surface of the collar against the interior of the mounting opening to mount the circuit board.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 3:
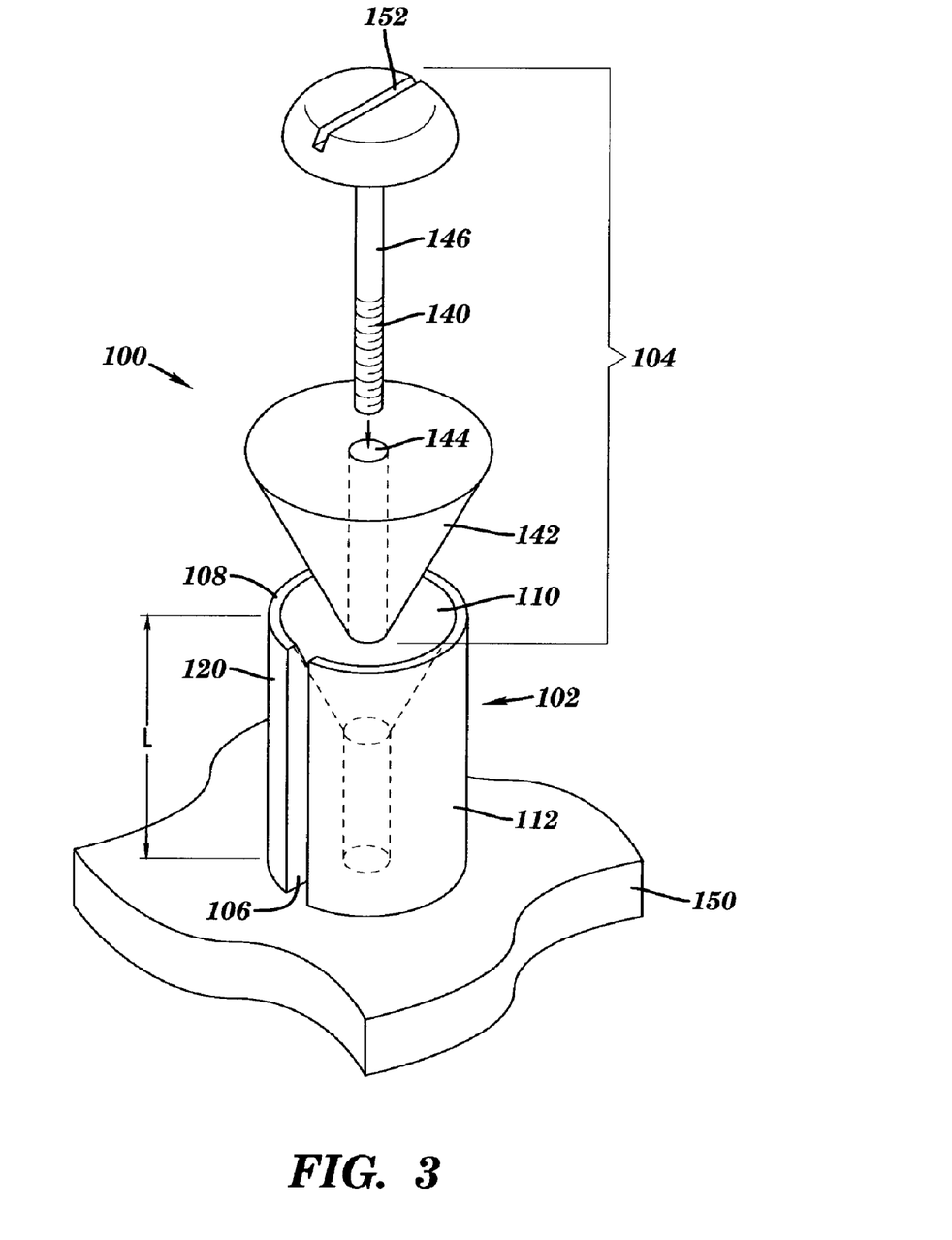
FIG. 3 shows an exploded perspective view of a first embodiment of a slit collar expandable standoff connector according to the invention.
Figure 4A:
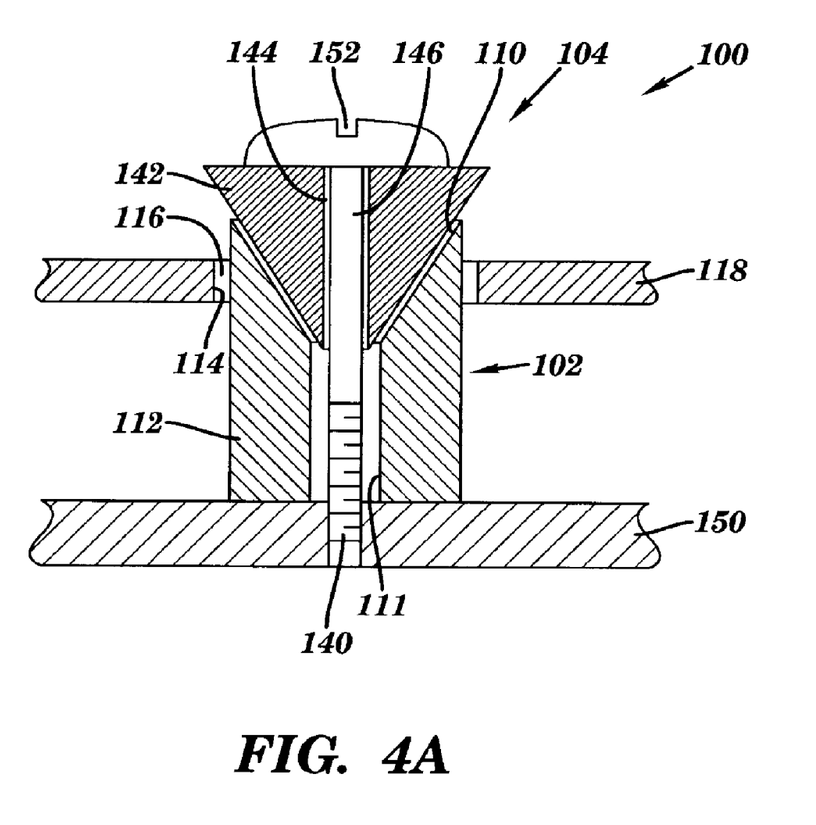
FIG. 4A shows a cross-sectional side view of the connector of FIG. 3 in a non-actuated position.
Figure 4B:
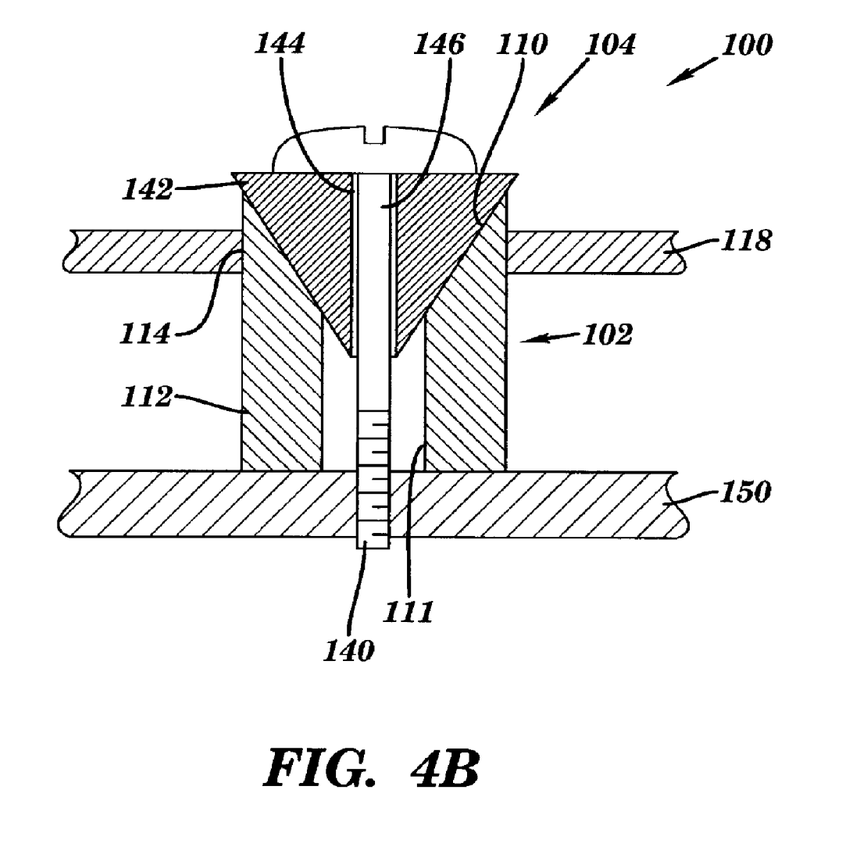
FIG. 4B shows a cross-sectional side view of the connector of FIG. 3 in an actuated position.

With reference to the accompanying drawings, FIGS. 3 and 4A–B show a first embodiment of an expanding standoff connector 100 for mounting a circuit board according to the invention. Connector 100 includes a collar 102 and a fastener 104. As shown in FIG. 3, collar 102 includes a slit 106 through a wall 108 of collar 102 that allows expansion of the collar, as will be described in more detail below. Collar 102 also includes a tapered interior surface 110 that is substantially conical. In addition, as shown in FIGS. 4A–B, collar 102 may also include a substantially cylindrical surface 111, although this is not necessary as shown in FIG. 3. An exterior surface 112 of collar 102 is configured to engage an interior 114 (FIG. 4A–B) of a mounting opening 116 (FIG. 4A) of circuit board 118. In particular, exterior surface 112 preferably has a shape configured to substantially match interior 114 of mounting opening 116.

Fastener 104 may be provided in a number of forms. In any embodiment, fastener 104 includes a threaded portion 140 and a substantially cone shaped portion 142. Substantially cone shaped portion 142 is configured to mate with tapered interior surface 110 of collar 102. FIGS. 3, 4A–4B illustrate a first embodiment of fastener 104 in which substantially cone-shaped portion 142 includes an opening 144 extending longitudinally therethrough, and threaded portion 140 includes a separate bolt 146 that extends through opening 144 to fasten into a chassis 150 to which circuit board 118 is mounted. Sufficient clearance is provided about separate bolt 146 to enable standoff 100 to be self-centering.

Figure 5:
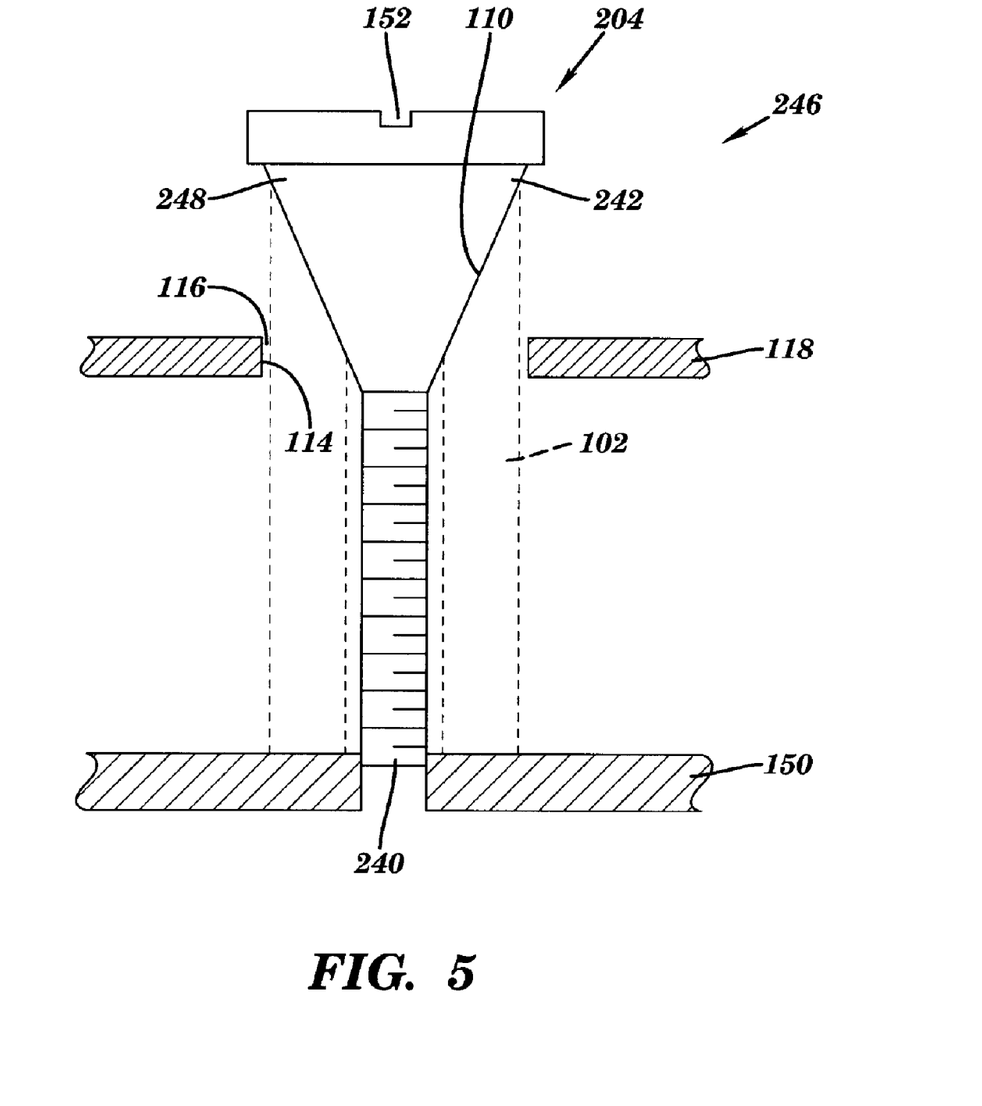
FIG. 5 shows a cross-sectional side view of an alternative embodiment of a fastener.

FIG. 5 illustrates a second embodiment of a fastener 204 in which a threaded portion 240 and substantially cone-shaped portion 242 are integral parts of fastener 204. That is, fastener 204 is provided as a bolt 246 having a substantially conical neck portion 248. In either situation, as fastener 104, 204 is advanced through collar 102, i.e., by threading of threaded portion 140, 240 into chassis 150, the fastener forces substantially cone shaped portion 140, 240 against tapered interior surface 110 to expand exterior surface 112 of collar 102 against interior 114 of mounting opening 116 to mount circuit board 118. Fastener 104, 204 also may include a tool engaging member 152 such as a screwdriver opening, fluting for a socket driver, hex head, threaded opening for a slide hammer, etc., for engaging by a tool (not shown) for adjusting the fastener.

Figure 6A:
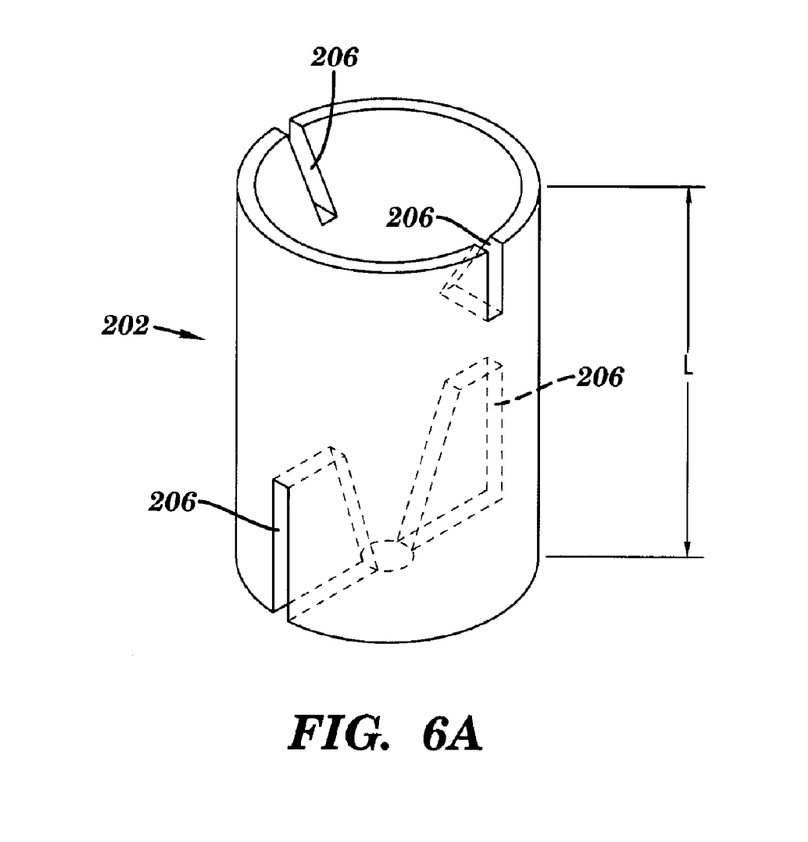
FIGS. 6A–B show perspective views of alternative embodiments of a collar.
Figure 6B:
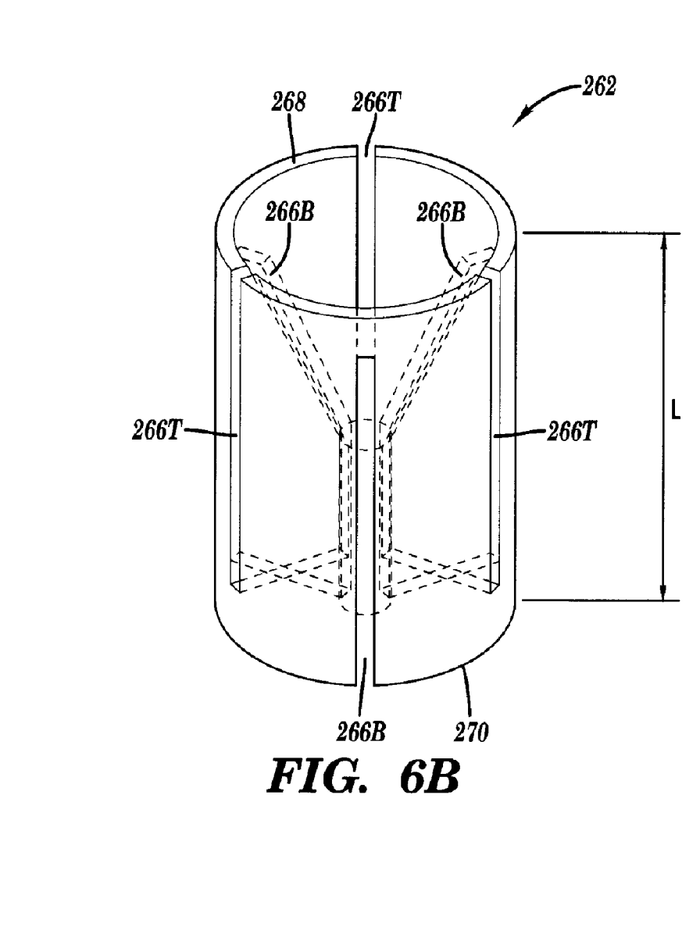
Figure 6C:
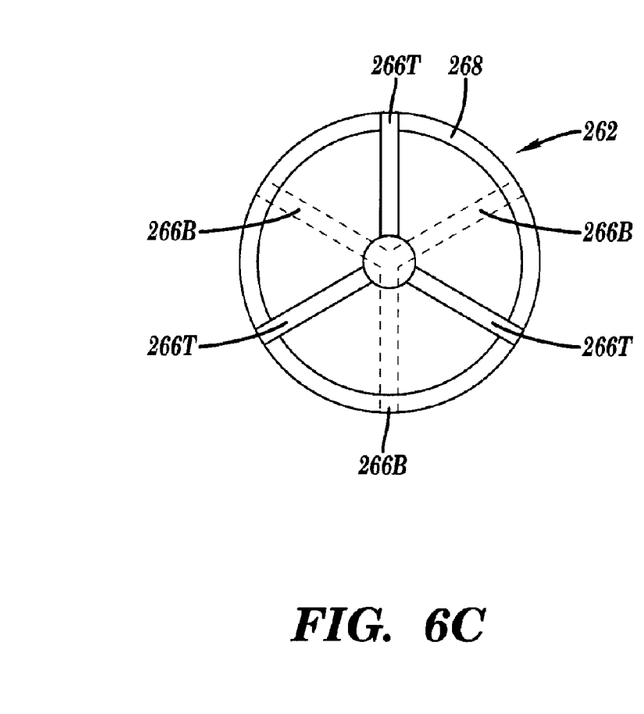
FIG. 6C shows a plan view of the collar of FIG. 6B.
Figure 6D:
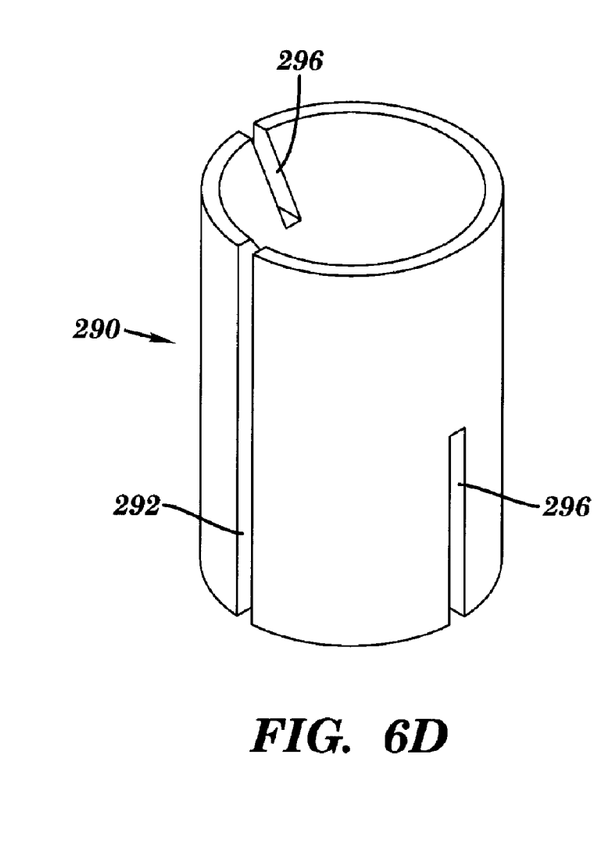
FIG. 6D shows a perspective view of another alternative embodiment of a collar.

Referring to FIGS. 3 and 6A–B, the collar can also be provided in a variety of forms. As shown in FIG. 3, collar 102 includes slit 106 that extends an entire longitudinal length L of the collar. However, this is not necessary. For example, as shown in FIG. 6A, a collar 202 includes at least one slit 206 (and preferably numerous slits 206) that extend only part of longitudinal length L of the collar. The extent to which slits 206 extend may be user defined depending on, for example, the amount of expansion of the collar desired. In one embodiment, numerous slits 206 are uniformly placed about the collar to ensure uniform expansion. In another embodiment, shown in FIGS. 6B–C, a collar 262 is illustrated including numerous slits 266T, 266B that only extend part of longitudinal length L of the collar. In this embodiment, slits 266T, 266B are uniformly placed about the collar to ensure uniform expansion. In contrast to the FIG. 6A embodiment, however, slits 266T, 266B overlap vertically within collar 262. Slits 266T extends from a top 268 of collar 26 and terminate prior to a bottom 270 of collar 262, while slits 266B extend from bottom 270 and terminate prior to top 268. Again, the extent to which slits 266T, 266B extend may be user defined depending on, for example, the amount of expansion of the collar desired. Collar 262 can expand substantially uniformly. FIG. 6D shows another embodiment of a collar 290 including one slit 292 that extends the entire longitudinal length L of the collar, and at least one (and preferably numerous) slits 296 that extend only part of longitudinal length L of the collar. The partial length slit 296 counteracts the collar's tendency to expand more at the top than at the bottom. Again, the extent to which slits 296 extend may be user defined depending on, for example, the amount of expansion of the collar desired.

Figure 7:
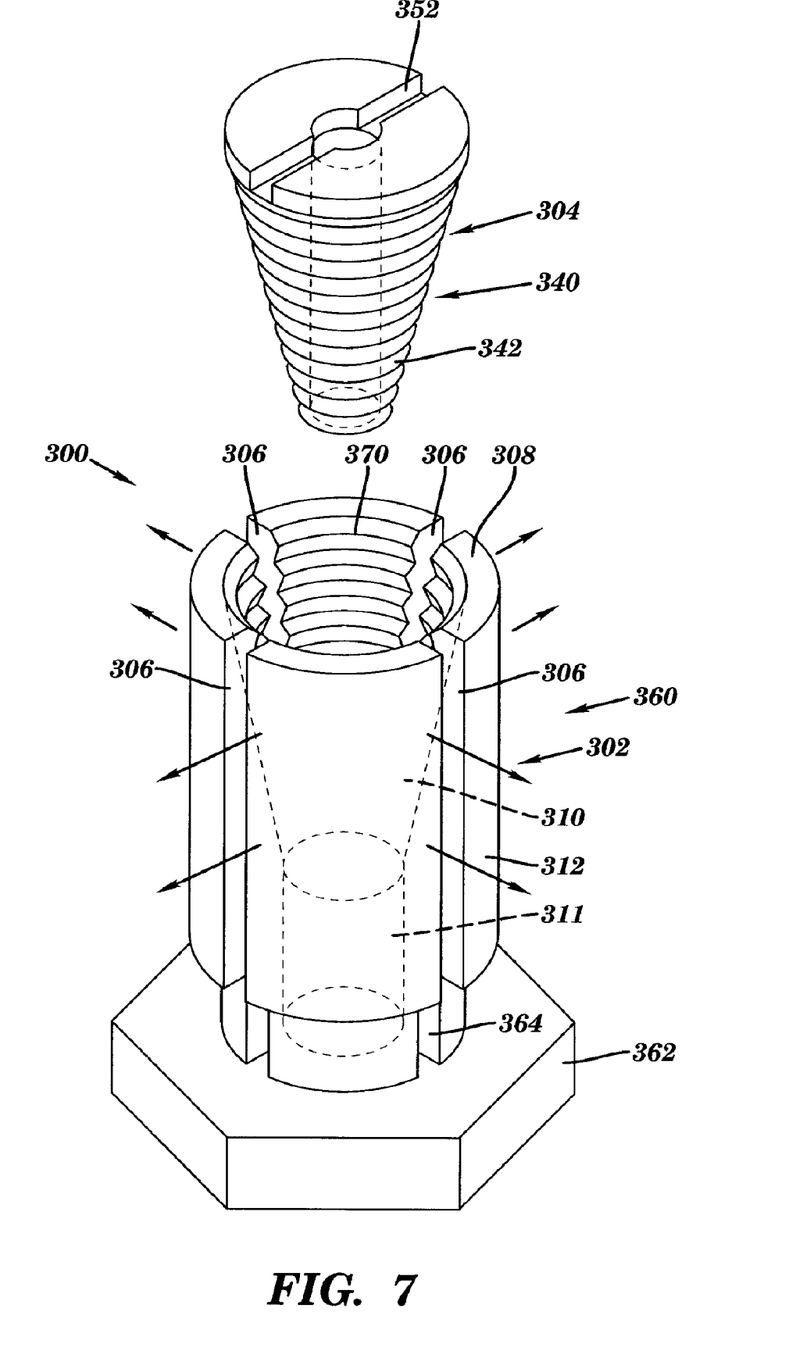
FIG. 7 shows an exploded perspective view of a second embodiment of a slit collar expandable standoff connector according to the invention.

Referring to FIG. 7, a second embodiment of an expandable standoff connector 300 is illustrated. In this embodiment, connector 300 includes a collar 302 and a fastener 304. As shown in FIG. 7, collar 302 includes an expanding slit region 360 having a tapered interior surface 310 and an exterior surface 312 for engaging an interior of a mounting opening of the circuit board (not shown). Collar 302 may also include a substantially cylindrical interior surface 311 adjacent tapered interior surface 310, but this is not necessary. Collar 302 also includes a base 362 with a relieved area 364 between base 362 and expanding slit region 360. Base 362 is coupled to a chassis (not shown) in any now known or later developed fashion. In this embodiment, fastener 304 includes a threaded portion 340 provided along a substantially cone-shaped portion 342, and tapered interior surface 310 includes mating threads 370 to threaded portion 340 such that fastener 304 can be threaded into collar 302. As shown, threaded portion 340 and substantially cone-shaped portion 342 are integral parts of fastener 304, however, this is not necessary. Expanding slit region 360 includes a plurality of slits 306 through a wall 308 of collar 302 that allows expansion of the collar as fastener 304 is advanced into expanding slit region 360. Relieved area 364 provides additional flexibility of collar 302 during expansion. Advancement of fastener 304 into collar 302 forces substantially cone shaped portion 340 against tapered and threaded interior surface 310 to expand exterior surface 312 of collar 302 against the interior of the mounting opening to mount the circuit board.

As in the previous embodiments, an exterior surface 312 of collar 302 is configured to engage the interior of the mounting opening of the circuit board (not shown) by, for example, having a shape configured to substantially match the interior of the mounting opening. In addition, fastener 304 may also include a tool engaging member 352, as described above, for engaging by a tool for adjusting the fastener.

The invention also includes a method for mounting a circuit board using an expandable standoff connector 100, 300. The method includes inserting a collar 102, 202, 302 within an interior 114 of a mounting opening 116 of circuit board 118. The collar includes a slit 106, 206, 306 through a wall of the collar, a tapered interior surface 110, 310 and an exterior surface 112, 312 configured to engage an interior of a mounting opening of the circuit board. Next, a fastener 104, 304 is provided including a threaded portion 140, 240, 340 and a substantially cone shaped portion 142, 242, 342 where the substantially cone shaped portion is configured to mate with tapered (and perhaps threaded) interior surface 110, 310 of the collar. Next, the fastener is advanced through (i.e., through or into) the collar to force the substantially cone shaped portion 141, 242, 342 against the tapered interior surface 110, 310 to expand the exterior surface of the collar against the interior of the mounting opening to mount the circuit board. As noted above, as shown in FIGS. 3, 4AB and 5, the advancing step may include threading the threaded portion into a chassis 150 to which the circuit board is mounted. Alternatively, as shown in FIG. 7, where threaded portion 340 is provided along substantially cone-shaped portion 342, and tapered interior surface 310 includes mating threads to the threaded portion, the advancing step may include threading threaded portion 342 into interior surface 310 of the collar.

Standoff connectors 100, 300, as described above, are also easily removable by rotatingly removing fastener 104, 204, 304, which allows easy removal of a circuit board for assembly rework or repair.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An expanding standoff connector for mounting a circuit board, the connector comprising:
    a collar including a slit through a wall of the collar, a tapered interior surface and an exterior surface configured to engage an interior of a mounting opening of the circuit board; and
    a fastener including a threaded portion and a substantially cone shaped portion, the substantially cone shaped portion configured to mate with the tapered interior surface of the collar,
    wherein advancement of the fastener through the collar forces the substantially cone shaped portion against the tapered interior surface to expand the exterior surface of the collar against the interior of the mounting opening to mount the circuit board, and wherein the threaded portion is provided along and on a surface of the substantially cone shaped portion, and the tapered interior surface includes mating threads to the threaded portion.

2. The connector of claim 1, wherein the slit extends an entire longitudinal length of the collar.

3. The connector of claim 1, wherein the collar includes a plurality of slits, with one of the slits extending an entire longitudinal length of the collar and the rest of the slits each extending only part of a longitudinal length of the collar.

4. The connector of claim 1, wherein the threaded portion and the substantially cone shaped portion are integral parts of the fastener.

5. The connector of claim 1, further comprising a body integrally coupled to the collar, and wherein the collar includes a plurality of slits that each extend an entire longitudinal length of the collar.

6. The connector of claim 1, wherein the collar includes a relieved area adjacent the body.

7. The connector of claim 1, wherein the fastener includes a tool engaging member for engaging by a tool for adjusting the fastener.

8. The connector of claim 1, wherein the slit extends only part of a longitudinal length of the collar.

9. The connector of claim 8, wherein the collar includes a plurality of slits that each extend only part of a longitudinal length of the collar.

10. The connector of claim 9, wherein the slits alternate extending from a top and a bottom of the collar.

11. An expanding standoff connector for mounting a circuit board, the connector comprising:
    a collar including an expanding slit region having a tapered and threaded interior surface and an exterior surface for engaging an interior of a mounting opening of the circuit board; and
    a fastener including a threaded portion provided along a substantially cone shaped portion, wherein the tapered, threaded interior surface mates with the threaded portion and the substantially cone shaped portion,
    wherein advancement of the fastener into the collar forces the substantially cone shaped portion against the tapered and threaded interior surface to expand the exterior surface of the collar against the interior of the mounting opening to mount the circuit boat, and wherein the threaded portion is provided along and on a surface of the substantially cone shared portion, and the tapered interior surface includes mating threads to the threaded portion.

12. The connector of claim 11, wherein the threaded portion and the substantially cone-shaped portion are integral parts of the fastener.

13. The connector of claim 11, wherein the expanding slit region extends only part of a longitudinal length of the collar.

14. The connector of claim 11, wherein the expanding slit region extends an entire longitudinal length of the collar.

15. The connector of claim 11, wherein the collar further includes a base adjacent the expanding slit region, and a relieved area between the base and the expanding slit region.

16. The connector of claim 11, wherein the fastener includes a tool engaging member for engaging by a tool for adjusting the fastener.

17. A method for mounting a circuit board using an expandable standoff connector, the method comprising the steps of:
    inserting a collar of the expandable standoff connector within an interior of a mounting opening of the circuit board, the collar including a slit through a wall of the collar, a tapered interior surface and an exterior surface configured to engage an interior of a mounting opening of the circuit board;
    providing a fastener including a threaded portion and a substantially cone shaped portion, the substantially cone shaped portion configured to mate with the tapered interior surface of the collar, the threaded portion being provided alone and on a surface of the substantially cone shaped portion, and the tapered interior surface including mating threads to the threaded portion; and
    advancing the fastener through the collar to force the substantially cone shaped portion against the tapered interior surface to expand the exterior surface of the collar against the interior of the mounting opening to mount the circuit board.

18. The method of claim 16, wherein the advancing step includes threading the threaded portion into a base to which the circuit board is mounted.

* * * * *

UNITED STATES PATENT AND TRADEMARK OFFICE
CERTIFICATE OF CORRECTION

PATENT NO. : 7,086,896 B2 Page 1 of 1
APPLICATION NO. : 10/904198
DATED : August 8, 2006
INVENTOR(S) : Edwards et al.

It is certified that error appears in the above-identified patent and that said Letters Patent is hereby corrected as shown below:

Claim 11, column 6, line 22, please remove "boat" and insert --board--.

Claim 17, cloumn 6, line 54, please remove "alone" and insert --along--.

Signed and Sealed this

Twelfth Day of December, 2006

JON W. DUDAS
*Director of the United States Patent and Trademark Office*